(12) United States Patent
Yamanaka (10) Patent No.: US 11,338,316 B2
(45) Date of Patent: May 24, 2022

(54) COATING APPARATUS AND COATING METHOD USING A COATING NEEDLE TO APPLY A LIQUID MATERIAL TO AN OBJECT

(71) Applicant: NTN CORPORATION, Osaka (JP)

(72) Inventor: Akihiro Yamanaka, Iwata (JP)

(73) Assignee: NTN CORPORATION, Osaka (JP)

( * ) Notice: Subject to any disclaimer, the term of this patent is extended or adjusted under 35 U.S.C. 154(b) by 0 days.

(21) Appl. No.: 16/328,488

(22) PCT Filed: Aug. 18, 2017

(86) PCT No.: PCT/JP2017/029667
§ 371 (c)(1),
(2) Date: Feb. 26, 2019

(87) PCT Pub. No.: WO2018/043161
PCT Pub. Date: Mar. 8, 2018

(65) Prior Publication Data
US 2019/0193101 A1 Jun. 27, 2019

(30) Foreign Application Priority Data
Aug. 29, 2016 (JP) .............................. JP2016-166606

(51) Int. Cl.
*B05C 1/02* (2006.01)
*B05D 1/28* (2006.01)
(Continued)

(52) U.S. Cl.
CPC .................. *B05C 1/02* (2013.01); *B05C 1/00* (2013.01); *B05C 5/0225* (2013.01);
(Continued)

(58) Field of Classification Search
None
See application file for complete search history.

(56) References Cited

U.S. PATENT DOCUMENTS 3,164,304 A * 1/1965 Holger .................. B01L 3/0255
222/192
3,334,354 A * 8/1967 Mutschler ............ H04N 1/0323
346/140.1
(Continued)

FOREIGN PATENT DOCUMENTS

CN 102044463 A 5/2011
CN 102755942 A 10/2012
(Continued)

OTHER PUBLICATIONS

Saruta et al., "Repair Technologies for Flat Panel Displays," NTN Technical Review No. 67, Nov. 1998 (English abstract).
(Continued)

*Primary Examiner* — Binu Thomas
(74) *Attorney, Agent, or Firm* — McDermott Will & Emery LLP (57) ABSTRACT

A coating apparatus applies a liquid material to a surface of a target object using a coating needle. The coating apparatus includes a coating unit having a coating needle and a container to hold a liquid material, a driving device configured to move the coating needle up and down, a Z-axis table configured to move the coating unit up and down, and a controller configured to drive the driving device and the Z-axis table to perform a coating operation. The controller adjusts the coating amount of the liquid material by controlling the driving device and the Z-axis table in accordance with an operation parameter set corresponding to the coating unit attached.

5 Claims, 9 Drawing Sheets

(51) Int. Cl.
  *B05C 5/02* (2006.01)
  *B05C 11/10* (2006.01)
  *B05C 1/00* (2006.01)
  *H01L 21/67* (2006.01)

(52) U.S. Cl.
  CPC ............ *B05C 11/1034* (2013.01); *B05D 1/28* (2013.01); *H01L 21/6715* (2013.01)

(56) References Cited

U.S. PATENT DOCUMENTS

| | | | | |
|---|---|---|---|---|
| 5,186,982 | A * | 2/1993 | Blette | B05C 1/00 118/243 |
| 6,605,257 | B1 | 8/2003 | Nakazawa et al. | |
| 2001/0009136 | A1 * | 7/2001 | Bryning | B01L 3/0251 118/256 |
| 2002/0100774 | A1 * | 8/2002 | Brooks | B05C 11/1034 222/504 |
| 2002/0173048 | A1 * | 11/2002 | Nakazawa | B82Y 30/00 436/180 |
| 2003/0209560 | A1 * | 11/2003 | Hui | B05C 11/1005 257/E21.505 |
| 2007/0090126 | A1 * | 4/2007 | Tanaka | B05C 11/1034 222/23 |
| 2008/0057180 | A1 * | 3/2008 | Weiss | B05C 11/1034 427/8 |
| 2018/0252512 | A1 | 9/2018 | Ohba | |

FOREIGN PATENT DOCUMENTS

| | | |
|---|---|---|
| CN | 105080788 A | 11/2015 |
| CN | 105247318 A | 1/2016 |
| DE | 265339 A1 | 3/1989 |
| JP | 2000-61379 A | 2/2000 |
| JP | 2001-046062 A | 2/2001 |
| JP | 2006-072307 A | 3/2006 |
| JP | 2006276188 A * | 10/2006 |
| JP | 2007-268353 A | 10/2007 |
| JP | 2008-191091 A | 8/2008 |
| JP | 2009-012259 A | 1/2009 |
| JP | 2012124381 A * | 6/2012 |
| JP | 2013109315 A * | 6/2013 |
| JP | 2017-096916 A | 6/2017 |
| JP | 2017225923 A * | 12/2017 |
| TW | 200639445 A | 11/2006 |
| WO | 2814/208362 A1 | 12/2014 |

OTHER PUBLICATIONS

International Search Report issued in International Application No. PCT/JP2017/029667, dated Nov. 21, 2017.
Chinese Office Action issuedin carresponding Chinese Patent Aoplication No. 201780052841.9, dated Aug. 27, 2020, with English translation.
Taiwanese Office Action issued in corresponding Taiwan Patent Application No. 106128565, dated Jul. 22, 2021, with English translation.
Chinese Office Action issued in corresponding Chinese Patent Application No. 201780052841.9, dated Oct. 21, 2021, with English translation.

* cited by examiner

AT TIME OF CONTACT → AFTER PUSHING

| CONTAINER NUMBER | STANDBY TIME (msec) | CONTACT TIME (msec) | PUSH AMOUNT ($\mu$m) |
|---|---|---|---|
| 1 | 20 | CT0 | d0 |
| 2 | 50 | CT0 | d0 |
| 3 | 0 | CT0+20 | d0 |
| 4 | 0 | CT0+40 | d0 |
| 5 | 0 | CT0 | d0+50 |
| 6 | 0 | CT0 | d0+100 |

FIG.12

COATING APPARATUS AND COATING METHOD USING A COATING NEEDLE TO APPLY A LIQUID MATERIAL TO AN OBJECT

CROSS REFERENCE

This application is a U.S. National Phase under 35 U.S.C. § 371 of International Application No. PCT/JP2017/029667, filed on Aug. 18, 2017 which claims the benefit of Japanese Application No. 2016-166606, filed on Aug. 29, 2016, the entire contents of both are hereby incorporated by reference.

TECHNICAL FIELD

The present invention relates to a coating apparatus and a coating method, and more specifically to control of the coating amount in a coating apparatus that coats a target object with a liquid material using a coating needle.

BACKGROUND ART

With recent miniaturization of electronics, there has been a growing demand for stably applying a very small amount of liquid material, for example, in such applications as application of a conductive material in implementation of crystal resonators, application of a catalytic material to a MEMS (Micro Electro Mechanical Systems) gas sensor, and application of an adhesive to an LED (Light Emitting Diode).

Fine coating is typically performed by printing, inkjet, and dispenser. The technique using a coating needle has also drawn attention because of its capability of fine coating using liquid materials with a wide variety of viscosities.

A method of performing fine coating with a liquid material using a coating needle is disclosed, for example, in Japanese Patent Laying-Open No. 2007-268353 (PTL 1), which proposes a method using a coating unit.

Such a coating unit is aimed to correct defects in minute patterns and is capable of fine coating using liquid materials with a wide variety of viscosities. In the coating operation, a coating needle protrudes from a through hole at the bottom of a container holding a liquid material. The coating needle performs transfer coating (hereinafter simply referred to as "coating") by bringing a coating liquid at the tip end thereof into contact with a coating target object.

CITATION LIST

Patent Literature

PTL 1: Japanese Patent Laying-Open No. 2007-268353

SUMMARY OF INVENTION

Technical Problem

In the coating unit as described in Japanese Patent Laying-Open No. 2007-268353 (PTL 1), the container for holding a liquid material may be replaceable in order to change the kind of liquid material used or to supply a liquid material depleted by coating.

In this case, for example, because of individual differences resulting from manufacturing errors of containers, such as the diameters of through holes at the bottom of containers, the coating amount may vary with containers even when the coating operation is performed under the same coating conditions.

With increasing miniaturization of electronics, it is necessary to reduce variation in the coating amount due to such differences of containers when an even smaller coating amount is required.

The present invention is made in order to solve such a problem and an object of the present invention is to reduce variation in the coating amount due to replacement of liquid material containers in a coating apparatus that applies a liquid material using a coating needle.

Solution to Problem

A coating apparatus according to the present invention applies a liquid material to a surface of a target object using a coating needle. The coating apparatus includes a coating unit, first and second driving devices, and a controller. The coating unit is configured to be replaceable and includes the coating needle and a container configured to hold the liquid material. The first driving device is configured to move the coating needle up and down. The second driving device is configured to move the coating unit up and down relative to the target object. The controller is configured to perform a coating operation of applying the liquid material to the target object by controlling the first and second driving devices. The controller is configured to adjust the coating amount of the liquid material by controlling the first and second driving devices in accordance with an operation parameter set corresponding to the coating unit attached.

Preferably, the container has a bottom having a hole. The controller is configured to apply the liquid material to a surface of the target object by moving the coating unit down using the second driving device while allowing the coating needle to protrude from the hole using the first driving device, and bringing the coating needle into contact with the target object.

Preferably, the operation parameter is a standby time in which a coating operation is on standby in a state in which the coating needle protrudes from the hole. When the coating amount is to be reduced, the standby time is extended. When the coating amount is to be increased, the standby time is shortened.

Preferably, the operation parameter is a contact time between the target object and the coating needle. When the coating amount is to be reduced, the contact time is shortened. When the coating amount is to be increased, the contact time is extended.

Preferably, the operation parameter is the push amount by which the coating unit further moves down from a state in which the target object and the coating needle are in contact with each other. When the coating amount is to be reduced, the push amount is reduced. When the coating amount is to be increased, the push amount is increased.

A coating method according to the present invention is a method of applying a liquid material to a surface of a target object using a coating needle in a coating apparatus. The coating apparatus includes a coating unit configured to be replaceable and first and second driving devices. The coating unit includes a container configured to hold a liquid material and the coating needle. The first driving device is configured to move the coating needle up and down. The second driving device is configured to move the coating unit up and down relative to the target object. The coating method includes: acquiring an operation parameter set corresponding to the coating unit attached; applying the liquid material to a surface of the target object by bringing the coating needle into contact with the target object using the first and second driving devices; measuring the coating amount of the liquid material applied; and adjusting the operation parameter based on the measured coating amount of the liquid material.

Advantageous Effects of Invention

According to the present invention, in a coating apparatus that applies a liquid material using a coating needle, an operation parameter for a driving device driven to perform a coating operation is adjusted for each liquid material container, thereby reducing variation in the coating amount due to replacement of liquid material containers.

DESCRIPTION OF EMBODIMENTS

Embodiments of the present invention will be described below with reference to the figures. In the following description, the same components are denoted by the same reference signs. Their names and functions are also the same. A detailed description thereof will not be repeated.

[Overall Configuration of Coating Apparatus]

Figure 1:
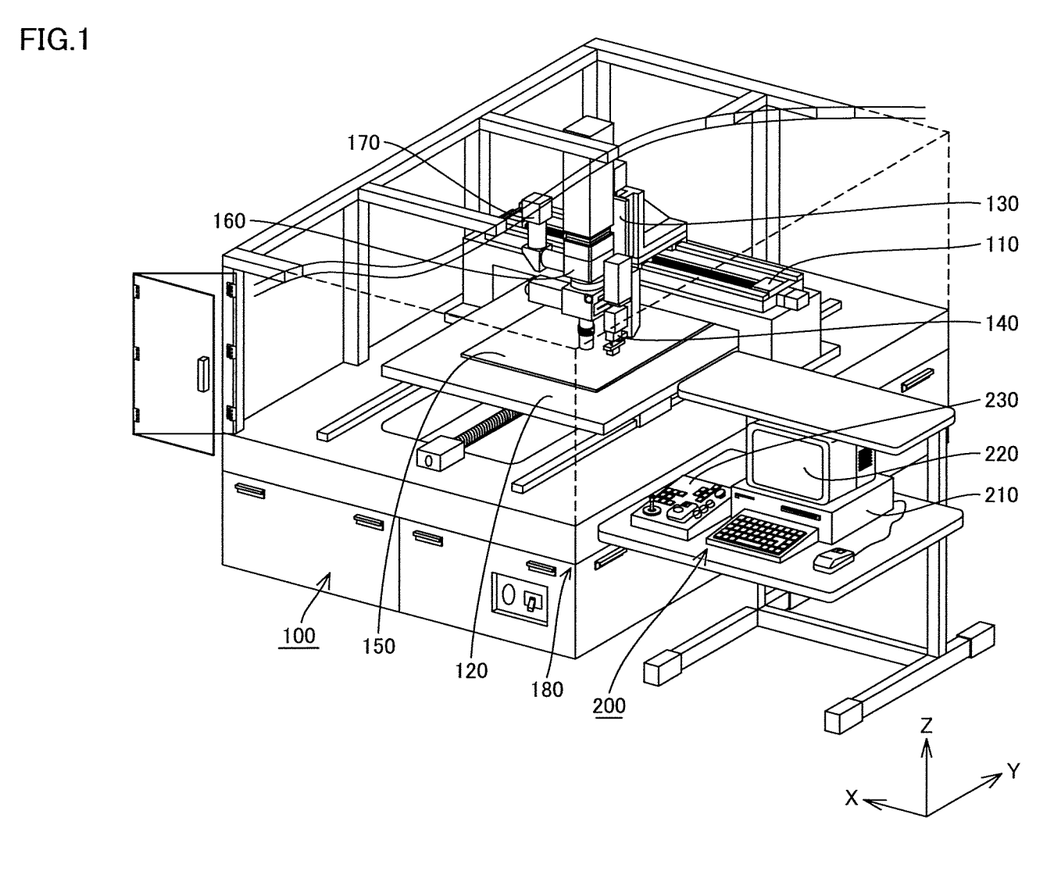
FIG. 1 is a schematic perspective view of an overall configuration of a coating apparatus according to an embodiment of the present invention.

FIG. 1 is a schematic perspective view of a coating apparatus 100 according to an embodiment of the present invention. Referring to FIG. 1, coating apparatus 100 includes a base 180 placed on the floor, an X-axis table 110, a Y-axis table 120, a Z-axis table 130, a coating unit 140, an observation optical system 160, a CCD camera 170 connected to observation optical system 160, and a controller 200.

On the upper surface of base 180, Y-axis table 120 movable in the Y-axis direction in FIG. 1 is installed. Specifically, guides are provided on the lower surface of Y-axis table 120 and connected slidably along guide rails installed on the upper surface of base 180. A ball screw is connected to the lower surface of Y-axis table 120. The ball screw is operated by a driver such as a motor so that Y-axis table 120 is movable along the guide rails (in the Y-axis direction). The upper surface of Y-axis table 120 serves as a placement surface on which a substrate 150 as a target object to be coated with a liquid material is placed.

On base 180, an arch-like structure is provided so as to extend across the guide rails on Y-axis table 120 in the X-axis direction. X-axis table 110 movable in the X-axis direction is installed on this structure. X-axis table 110 is movable in the X-axis direction, for example, using a ball screw.

Z-axis table 130 is installed on the movable body of X-axis table 110, and coating unit 140 and observation optical system 160 are installed on this Z-axis table 130. Coating unit 140 and observation optical system 160 are movable together with Z-axis table 130 in the X-axis direction. Coating unit 140 is provided for applying a coating liquid on a coating surface (upper surface side) of substrate 150 using a not-shown coating needle (described later) provided in the coating unit. Observation optical system 160 is provided for observing a coating position in coating target substrate 150. CCD camera 170 for observation optical system 160 converts the observed image into an electrical signal. Z-axis table 130 supports these coating unit 140 and observation optical system 160 such that they are movable in the Z-axis direction.

Controller 200 includes a control computer 210, an operation panel 230, and a monitor 220 to control X-axis table 110, Y-axis table 120, Z-axis table 130, coating unit 140, and observation optical system 160. Operation panel 230 is used for inputting a command to control computer 210. Monitor 220 displays image data converted by CCD camera 170 for observation optical system 160 and output data output from control computer 210.

When a liquid material is applied to substrate 150, the coating position is determined by moving the coating position of coating target substrate 150 to immediately below observation optical system 160 with X-axis table 110 and Y-axis table 120, and observing and checking the coating position with observation optical system 160. A liquid material is then applied to the determined coating position. Subsequently, X-axis table 110 and Y-axis table 120 are operated to move substrate 150 such that the next coating position comes immediately below coating unit 140. Upon completion of the moving, coating unit 140 is driven to perform coating. This is successively repeated.

The relation between the descending end position of the coating needle and the focus position of observation optical system 160 is stored in advance. At the time of coating, with reference to the position where an image is focused by observation optical system 160 in the Z-axis direction, the Z-axis direction position is moved with the Z-axis table to the height where the coating needle comes into contact with substrate 150, and the coating is thereafter performed. When the coating area is large and the substrate surface height of coating target substrate 150 significantly varies during the coating process, the focus position is checked during the process, if necessary, and the position in the Z-axis direction is corrected before coating. This adjustment of the focus position may be done by automatic focusing using image processing or by real-time correction by detecting the height position of the surface of coating target substrate 150 using a laser sensor or the like.

Figure 2:
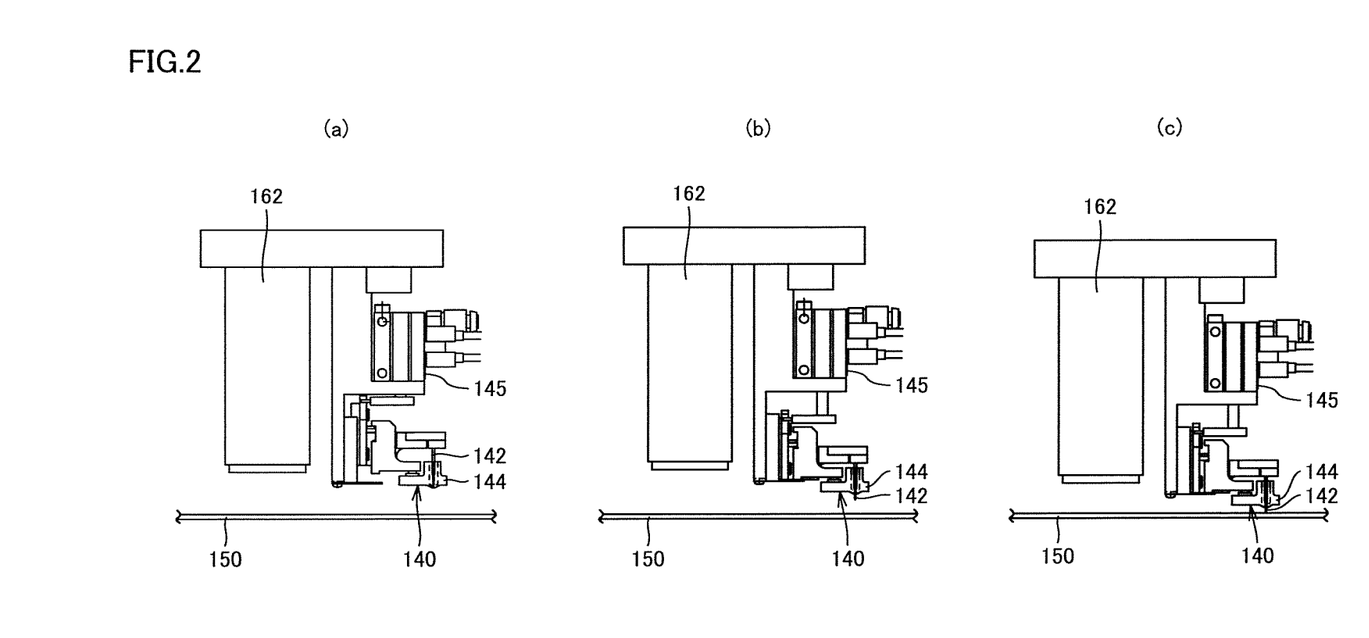
FIG. 2 is a diagram illustrating a main part of a coating mechanism in FIG. 1.
Figure 3:
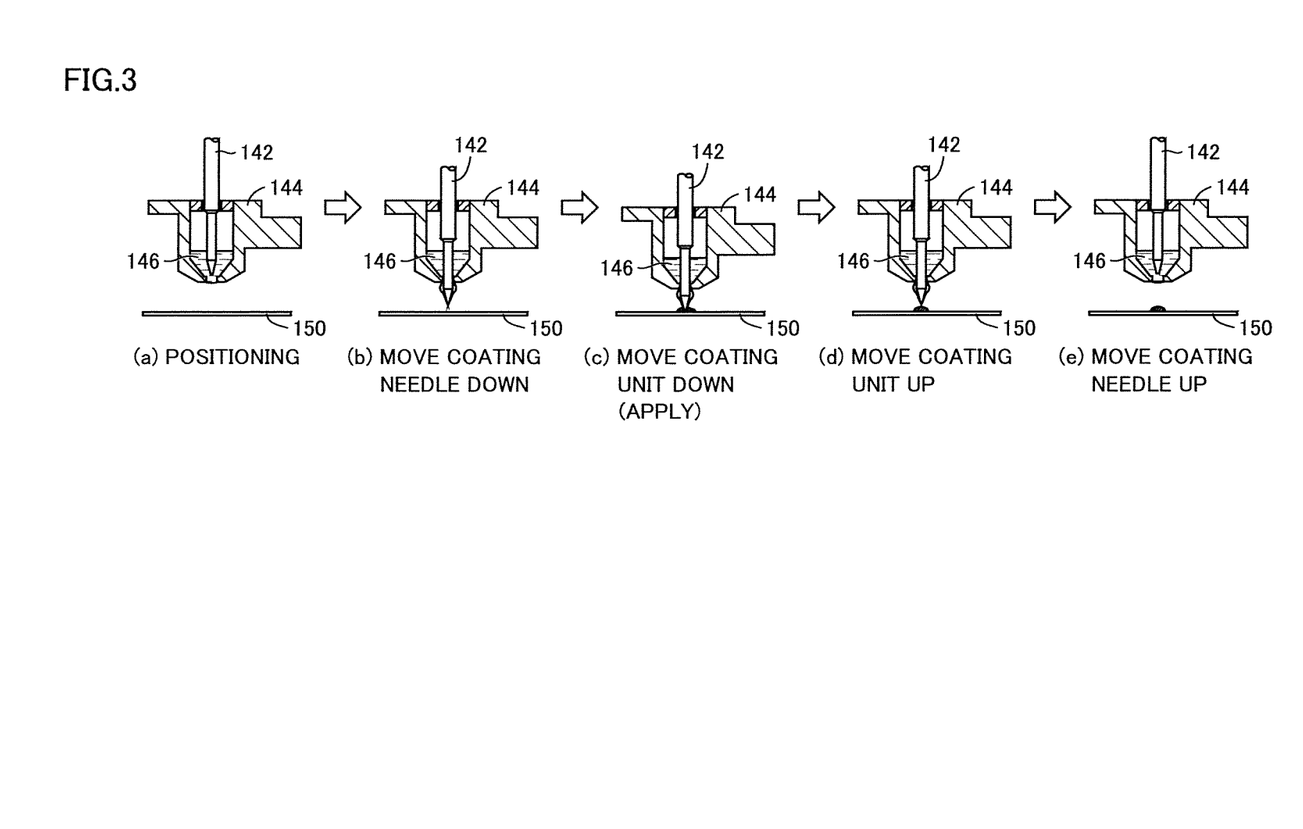
FIG. 3 is a diagram for explaining a coating operation.

FIG. 2 is a diagram illustrating the main part of the coating mechanism in FIG. 1 and illustrating the coating operation with a liquid material. Coating unit 140 includes a coating needle 142 and a liquid material container (hereinafter simply referred to as "container") 144 for storing a liquid material. Coating needle 142 is moved up/down by a driving device 145 provided in the coating mechanism. FIG. 3 illustrates the operation of coating needle 142 and container 144 in the coating operation in an enlarged view.

Referring to FIG. 2 and FIG. 3, first of all, as shown in FIG. 2(a) and FIG. 3(a), X-axis table 110 and Y-axis table 120 illustrated in FIG. 1 are driven so that the coating position of coating target substrate 150 is positioned under coating needle 142 of coating unit 140. Here, the tip end of coating needle 142 is soaked in a liquid material 146 in container 144.

Then, as illustrated in FIG. 2(b) and FIG. 3(b), driving device 145 is used to move coating needle 142 down so that the tip end of coating needle 142 protrudes from a hole at the bottom of container 144. Here, liquid material 146 adheres to the tip end of coating needle 142, but the tip end is not yet in contact with substrate 150.

Then, when coating needle 142 is completely moved down, as illustrated in FIG. 2(c) and FIG. 3(c), Z-axis table 130 is driven to move coating unit 140 downward to bring the tip end of coating needle 142 into contact with substrate 150. Liquid material 146 is thus applied on substrate 150. Subsequently, Z-axis table 130 moves coating unit 140 upward (FIG. 3(d)), and driving device 145 moves coating needle 142 upward to finish the coating operation (FIG. 3(e)).

In the coating apparatus as described above, the container in the coating unit is usually replaceable in order to change the kind of liquid material used or supply a liquid material depleted by coating. A plurality of containers may be replaced and used as appropriate.

In such a case, even when coating is performed under the same coating conditions, the coating amount may slightly vary with containers because of process errors during manufacturing of containers or wear over years.

Figure 4:
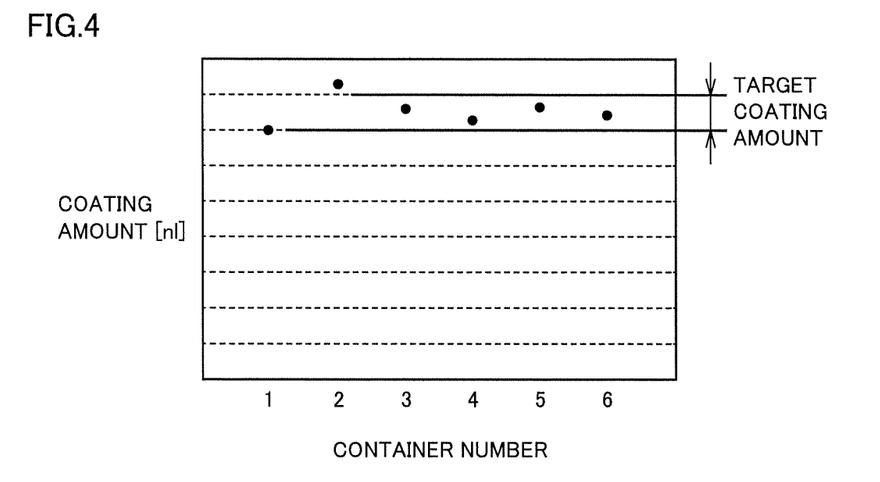
FIG. 4 is a diagram illustrating an example of variation in the coating amount due to differences of liquid material containers.

In particular, as coating targets are increasingly miniaturized in recent years, the coating amount on targets is even smaller. Therefore, as shown in FIG. 4, because of variation in the coating amount among containers used, the coating amount may fail to fall within a range of coating amount target values even under the same coating conditions.

Then, in the present embodiment, we focus on the behavior of the liquid material in the coating needle during coating operation, exhibited due to the viscosity and the surface tension of the liquid material, and employ a configuration for minutely adjusting the coating amount by adjusting the operation parameters related to the operation timing during coating operation depending on the container used.

Figure 5:
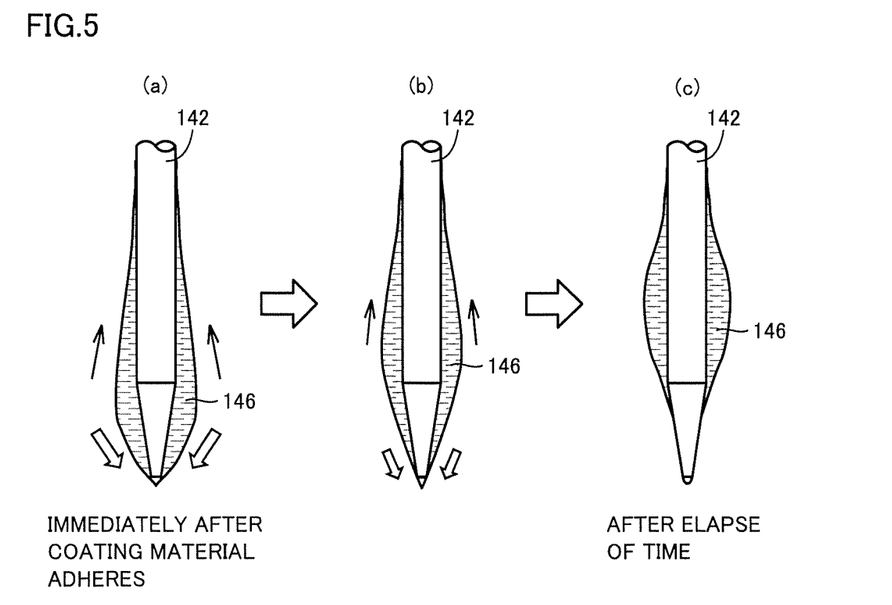
FIG. 5 is a diagram for explaining behavior of a liquid material during coating standby.

The adjustment of the coating amount in the present embodiment will be described with reference to FIGS. 5 to 10 as follows. FIG. 5 illustrates the behavior of liquid material 146 when the coating operation is on standby with coating needle 142 protruding from the hole at the bottom of container 144 in FIG. 3(b). In the example illustrated in FIG. 5, it is assumed that the viscosity of liquid material used is approximately tens of thousands cP.

As illustrated in FIG. 5(a), immediately after coating needle 142 protrudes from the hole at the bottom of container 144, liquid material 146 adheres to the lower side of coating needle 142 under the effect of gravity. With the effect of viscosity and surface tension of liquid material 146, liquid material 146 moves along coating needle 142 upward with time (FIG. 5(b)). In this state, the liquid material adhering to the tip end of coating needle 142 is continuous with the liquid material adhering to the side surface portion of coating needle 142. Therefore, when coating needle 142 is brought into contact with substrate 150 in this state, the liquid material adhering to the tip end of coating needle 142 as well as part of the liquid material adhering to the side surface portion is applied on substrate 150.

On the other hand, after the elapse of a sufficient time, as illustrated in FIG. 5(c), the liquid material on the side surface portion of coating needle 142 further moves up and becomes separate from the liquid material adhering to the tip end of coating needle 142. When coating needle 142 is brought into contact with substrate 150 in this state, the liquid material adhering to the side surface portion of coating needle 142 is not applied on substrate 150, and only the liquid material adhering to the tip end of coating needle 142 is applied on substrate 150. That is, the coating amount can be adjusted by adjusting the coating standby time in which the tip end of coating needle 142 is on standby while protruding from the hole at the bottom of container 144, as an operation parameter.

Figure 6:
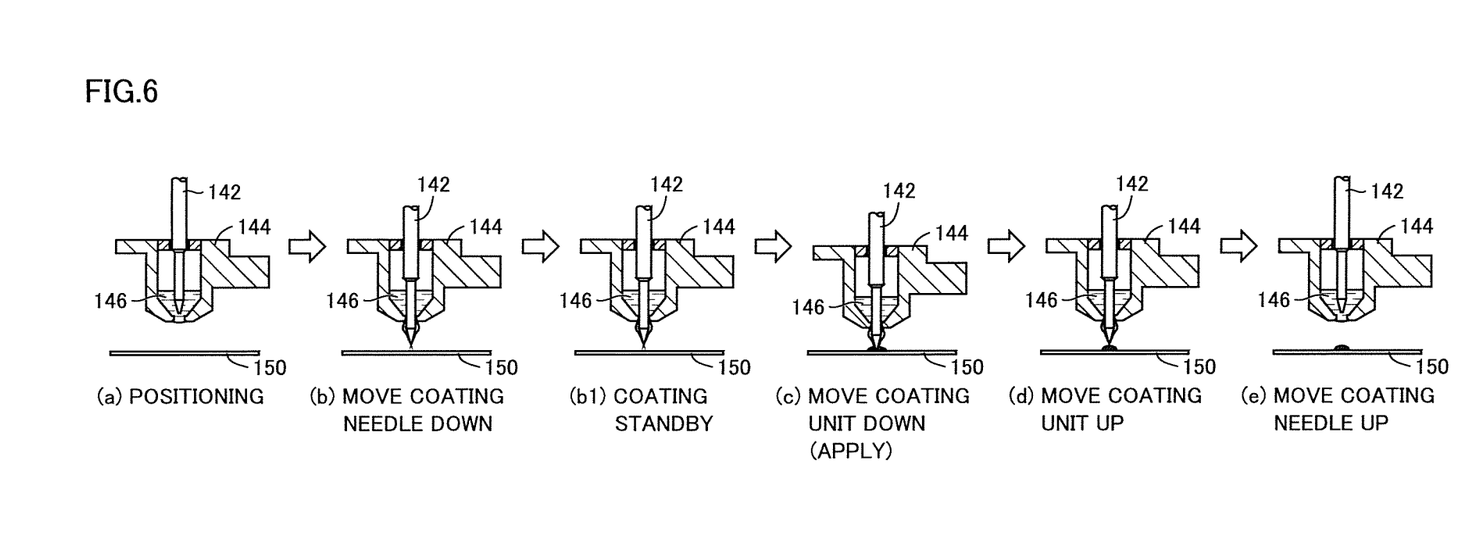
FIG. 6 is a diagram for explaining the detail of the coating operation in the present embodiment.

FIG. 6 is a diagram for explaining the detail of the coating operation when the coating standby is performed. In FIG. 6, the step (b1) of performing coating standby is added to FIG. 4.

In FIG. 6(b), when driving device 145 is driven to allow coating needle 142 to protrude from the hole at the bottom of container 144, as shown in FIG. 6(b1), the state is kept for a predetermined time (hereinafter also referred to as "coating standby time") (for example, about 0 to 300 msec) corresponding to the container used, so that the operation of moving coating unit 140 down by Z-axis table 130 (FIG. 6(c)) is delayed.

After the elapse of a predetermined coating standby time, as shown in FIG. 6(c), Z-axis table 130 is driven to move coating unit 140 downward to apply the liquid material to substrate 150.

Figure 7:
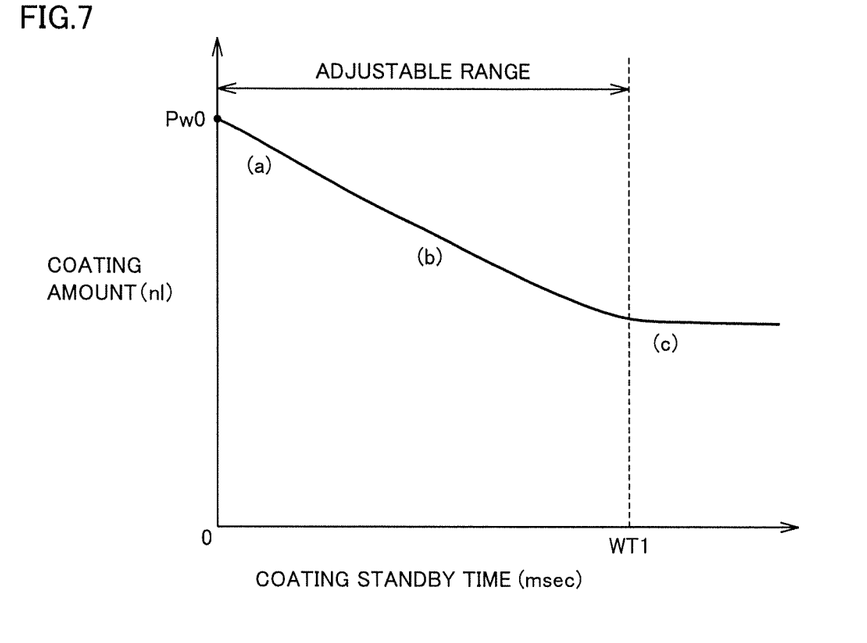
FIG. 7 is a diagram illustrating an example of the relation between the coating standby time and the coating amount.

FIG. 7 is a diagram illustrating an example of the relation between the coating standby time of coating needle 142 and the coating amount. In FIG. 7, the horizontal axis shows the coating standby time and the vertical axis shows the coating amount applied on substrate 150. In FIG. 7, it is assumed that the coating conditions other than the coating standby time (for example, the contact time between coating needle 142 and substrate 150) are the same.

As shown in FIG. 7, as the coating standby time increases, the coating amount gradually decreases from the state of the coating amount Pw0 in which the coating standby time is zero (corresponding to FIG. 5(a)). After the coating standby time is WT1 in the figure, the coating amount becomes almost constant because the liquid material adhering to the tip end of coating needle 142 becomes separate from the liquid material adhering to the side surface portion, as shown in FIG. 5(c).

Since the shorter coating standby time is preferable in terms of the cycle time of the apparatus, a zero standby time is set as the initial state, and the coating amount can be decreased by increasing (extending) the coating standby time. When the coating standby time is already set to a predetermined time that is not zero, the coating amount can be increased by reducing (shortening) the coating standby time in a range until the coating standby time is zero.

On the other hand, in the present embodiment, as a method of adjusting the coating amount to increase, the contact time between coating needle 142 and substrate 150 as a coating target object is adjusted in the step in FIG. 6(c). This also uses the effect of viscosity and surface tension of liquid material 146. As the contact time increases in the state in FIG. 5(b), the liquid material adhering to coating needle 142 easily spreads along substrate 150.

Figure 8:
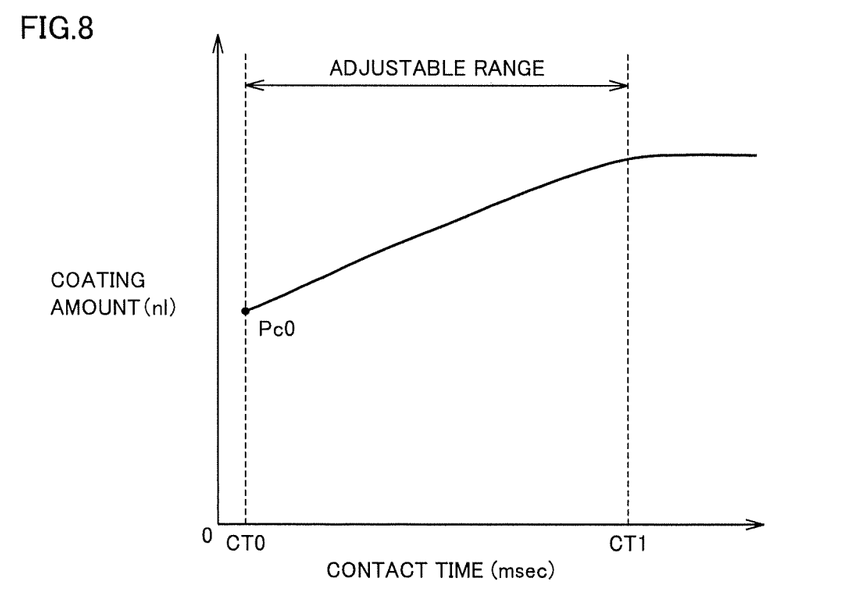
FIG. 8 is a diagram illustrating an example of the relation between the contact time of the coating needle and the coating amount.

FIG. 8 is a diagram illustrating an example of the relation between the contact time between coating needle 142 and substrate 150 and the coating amount. In FIG. 8, the horizontal axis represents the contact time between coating needle 142 and substrate 150, and the vertical axis represents the coating amount applied on substrate 150. In FIG. 8, it is assumed that the coating standby time is constant.

Referring to FIG. 8, when the minimum contact time between coating needle 142 and substrate 150 is CT0, the initial coating amount Pc0 gradually increases as the contact time increases. When the contact time exceeds CT1, the coating amount is almost constant.

Since the shorter contact time is also preferable in terms of the cycle time of the apparatus, the coating amount Pc0 when the minimum contact time is CT0 is set as the initial state, and then the adjustment for increasing the coating amount is achieved by increasing (extending) the contact time. When the contact time is already set to be longer than initial state CT0, the coating amount can be decreased by reducing (shortening) the contact time.

As the parameter for adjusting the contact time, for example, the time count from the point of time when coating needle 142 comes into contact with substrate 150 can be used. In this case, the contact between substrate 150 and coating needle 142 can be determined based on, for example, contact pressure, electric resistance, or a change in position of the Z-axis table. Alternatively, the "push amount" of coating needle 142 when coating unit 140 is moved down may be set as an operation parameter.

Figure 9:
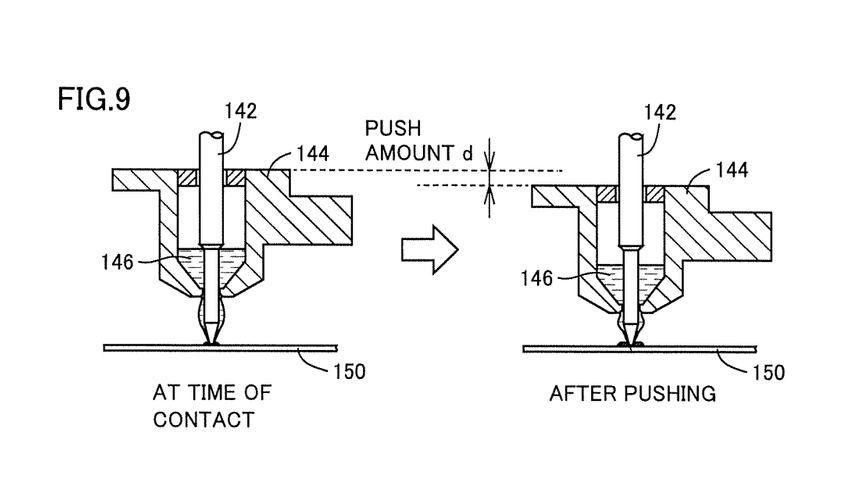
FIG. 9 is a diagram for explaining pushing of the coating needle during the coating operation.

Here, the "push amount" of coating needle 142 is the amount of coating unit 140 further moving down from the contact state between substrate 150 and coating needle 142, as illustrated in FIG. 9. Alternatively, the "push amount" can be said as the amount of coating needle 142 pushed back into container 144. An attachment part of coating needle 142 is provided with a not-shown slide mechanism configured to release force applied in the pushed state as illustrated in FIG. 9 by moving down coating unit 140. By setting this push amount d as an operation parameter, the time parameter can be set as a parameter of moving distance (that is, position) of Z-axis table 130.

Figure 10:
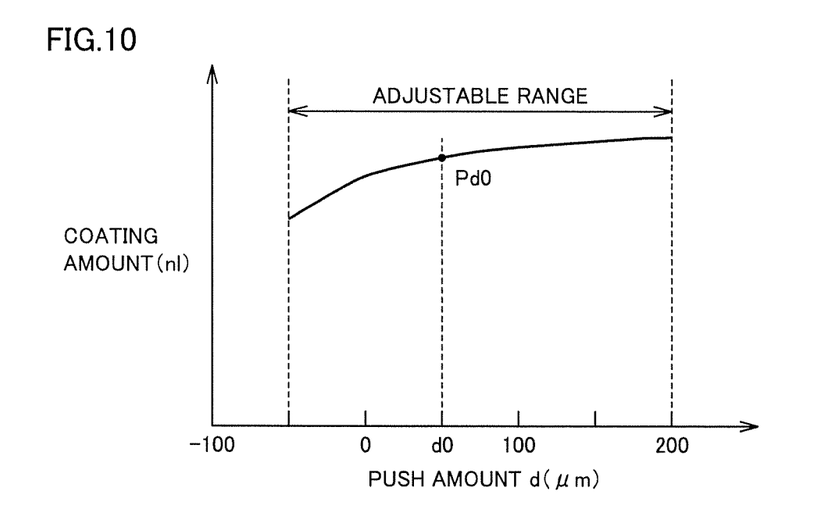
FIG. 10 is a diagram illustrating an example of the relation between the push amount of the coating needle and the coating amount.

FIG. 10 is a diagram illustrating an example of the relation between the push amount d of coating needle 142 and the coating amount. In FIG. 10, the horizontal axis represents the push amount, and the vertical axis represents the coating amount applied on substrate 150. Here, FIG. 10 illustrates the coating amount when the push amount is negative. This is because even when coating needle 142 is not actually in contact with substrate 150, the liquid material may be in contact with substrate 150 because of the amount of liquid material protruding from the tip end.

In order to ensure the contact between coating needle 142 and substrate 150 and thereby prevent coating deficiency, the push amount d is generally set to a value d0 (for example, 50 μm) slightly positive relative to zero. Therefore, when the coating amount Pd0 in this state is set as the initial state, the adjustment for increasing the coating amount is achieved by setting a large push amount d (increasing). When the push amount d is already set to be larger than in initial state d0, the coating amount can be reduced by setting a smaller push amount (reducing).

In order to achieve a desired coating amount for each container, the operation parameters "coating standby time", "contact time", and "the push amount" are obtained, for example, through experiments, and the operation parameters are set in control computer 210 during replacement of containers, whereby variation in the coating amount resulting from individual differences of containers can be suppressed.

The operation parameters may be set by an operator inputting the operation parameters to control computer 210 every time the container is replaced. Alternatively, a map of operation parameters may be stored in advance in control computer 210 so that the operator selects the number of a container used to automatically set the operation parameters. Alternatively, an RFID (radio frequency identification) tag or a two-dimensional barcode may be affixed to each container so that a not-shown reader reads the RFID data or information of the two-dimensional barcode to allow control computer 210 to automatically recognize the target container number and automatically set the operation parameters.

Figure 11:
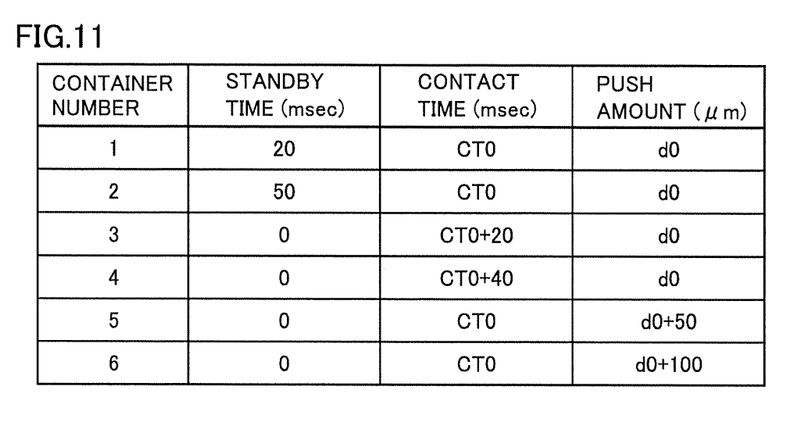
FIG. 11 is a diagram for explaining an example of the map of operation parameters corresponding to each liquid material container.

FIG. 11 is a diagram illustrating an example of the map of operation parameters corresponding to each container that is stored in control computer 210. In FIG. 11, the default value of "coating standby time" is zero, the default value of "contact time" is CT0, and the default value of "the push amount" is d0.

In the map in FIG. 11, for container numbers 1 and 2, the contact time and the push amount are set to default values, and the coating amount is adjusted so as to decrease from the default state by adjusting the coating standby time. For container numbers 3 and 4, the coating amount is adjusted so as to increase from the default value by adjusting the contact time. For container numbers 5 and 6, the coating amount is adjusted so as to increase from the default value by adjusting the push amount.

By presetting the operation parameters corresponding to each container as described above, variation in the coating amount can be suppressed even when the container is replaced. However, the state of the container may change because of the property of the liquid material used or change over time due to continuous use. In such a case, it is preferable to periodically measure the coating amount online or offline and correct the operation parameters as appropriate.

The coating amount P can be calculated, for example, from the coating diameter and the coating height of the liquid material applied on substrate 150. The coating diameter and the coating height may be measured using observation optical system 160 of coating apparatus 100 or may be measured using equipment in the next step, different from the coating apparatus.

Figure 12:
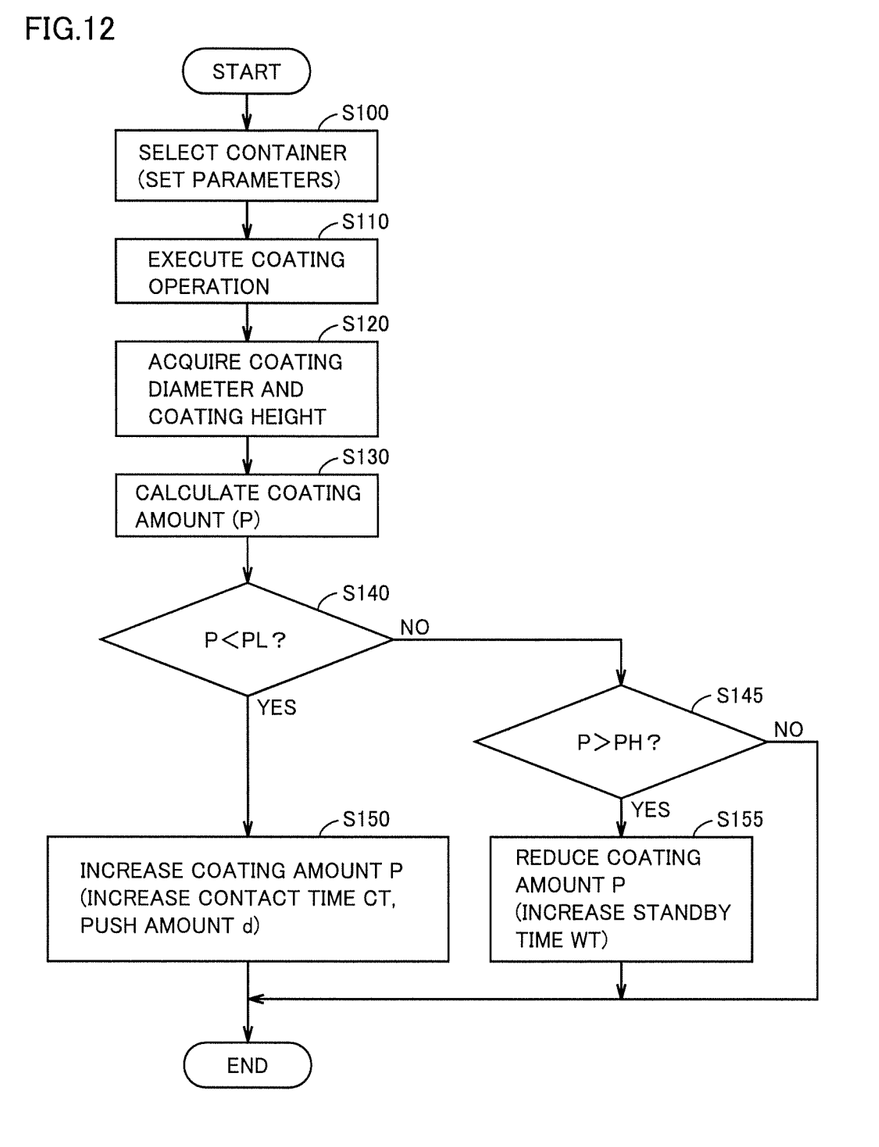
FIG. 12 is a flowchart for explaining the process of adjusting the coating amount of a liquid material that is executed in the present coating apparatus.

FIG. 12 is a flowchart for explaining the process of adjusting the coating amount of a liquid material that is executed in control computer 210 in coating apparatus 100 according to the present embodiment.

Referring to FIG. 12, at step (hereinafter step is abbreviated as "S") 100, control computer 210 acquires and sets the operation parameters for a container attached to coating apparatus 100. The operation parameters may be acquired by the user input as described above or may be automatically acquired by control computer 210 through communication.

Subsequently, at S110, control computer 210 executes a coating operation in accordance with the set operation parameters. Then, at S120, control computer 210 acquires information on the coating diameter and the coating height of the applied liquid material. The acquired coating diameter and coating height may be information measured by a detector provided on coating apparatus 100 or may be information measured in the subsequent step.

At S130, control computer 210 calculates the coating amount P from the acquired coating diameter and coating height. At S140, control computer 210 determines whether the coating amount P falls below a predetermined lower limit value PL. If the coating amount P falls below lower limit value PL (YES at step S140), control computer 210 determines that the coating amount P is insufficient, and adjusts the operation parameter such that the coating amount P is increased in the next coating operation (S150). Specifically, as described with FIG. 8 and FIG. 10, control computer 210 adjusts the operation parameters such that contact time CT between coating needle 142 and substrate 150 or the push amount d of coating needle 142 is increased.

If the coating amount P is equal to or greater than lower limit value PL (NO at S140), then at S145, control computer 210 determines whether the coating amount P exceeds an upper limit value PH. If the coating amount P exceeds upper limit value PH (YES at step S145), control computer 210 determines that the coating amount P is excessive, and adjusts the operation parameter such that the coating amount P is reduced in the next coating operation (step S155). Specifically, as described with FIG. 7, the parameter is adjusted such that coating standby time WT is longer in the next coating operation. If the coating amount P is equal to or smaller than upper limit value PH (NO at S145), control computer 210 determines that the coating amount P is adequate and terminates the process.

At steps S150 and S155 described above, the coating amount is adjusted on the premise that the operation parameters are in the initial state (specifically, the coating standby time is 0, the contact time is CT0, and the push amount is d0). However, for example, the parameters may have been adjusted such that coating standby time WT is increased in order to reduce the coating amount, in the previous determination. In such a case, if the coating amount needs to be increased according to the determination this time, it is preferable that the coating standby time WT is reduced first, and if the required coating amount is not yet satisfied, the contact time CT or the push amount d is adjusted.

Control computer 210 performs control in accordance with the process as described above, whereby the coating amount of a liquid material can be adjusted for each container, and a desired coating amount can be stably supplied even when the coating unit is replaced. This can improve and stabilize the product quality.

In the present embodiment, control computer 210 is configured to calculate the coating amount P from the coating diameter and the coating height of the liquid material applied on the substrate and adjust the coating amount. However, control computer 210 may be configured to adjust the coating amount, for example, based on the coating height.

The embodiment disclosed here should be understood as being illustrative rather than being limitative in all respects. The scope of the present invention is shown not in the foregoing description but in the claims, and it is intended that all modifications that come within the meaning and range of equivalence to the claims are embraced here.

REFERENCE SIGNS LIST 100 coating apparatus, 110 X-axis table, 120 Y-axis table, 130 Z-axis table, 140 coating unit, 142 coating needle, 144 container, 145 driving device, 146 liquid material, 150 substrate, 160 observation optical system, 170 CCD camera, 180 base, 200 controller, 210 control computer, 220 monitor, 230 operation panel.

The invention claimed is:

1. A coating apparatus configured to apply a liquid material to a surface of a target object using a coating needle, the coating apparatus comprising:
   a coating unit configured to be replaceable and including a container and the coating needle, the container being configured to hold the liquid material;
   a first driving device configured to move the coating needle up and down;
   a second driving device configured to move the coating unit up and down relative to the target object; and
   a controller configured to:
      acquire an operation parameter set corresponding to the coating unit attached;
      control the first and second driving devices to perform a coating operation of applying the liquid material to the target object based on the operation parameter;
      after applying the liquid material to the target object, acquire a coating amount of the liquid material that has been applied to the target object; and
      adjust the operation parameter based on the acquired coating amount of the liquid material, wherein
   the container has a bottom having a hole,
   the controller is configured to apply the liquid material to the surface of the target object by moving the coating unit down using the second driving device while allowing the coating needle to protrude from the hole using the first driving device, and bringing the coating needle into contact with the target object,
   the operation parameter is a push amount by which the coating unit is further moved down from a state in which the target object and the coating needle are in contact with each other,
   when the coating amount is to be reduced, the controller reduces the push amount, and
   when the coating amount is to be increased, the controller increases the push amount.

2. The coating apparatus according to claim 1, wherein the operation parameter is a standby time in which the coating operation is on standby in a state in which the coating needle protrudes from the hole, and
   when the coating amount is to be reduced, the controller extends the standby time, and
   when the coating amount is to be increased, the controller shortens the standby time.

3. The coating apparatus according to claim 1, wherein the operation parameter is a contact time between the target object and the coating needle, and
   when the coating amount is to be reduced, the controller shortens the contact time, and
   when the coating amount is to be increased, the controller extends the contact time.

4. The coating apparatus according to claim 2, wherein the operation parameter is a contact time between the target object and the coating needle, and
   when the coating amount is to be reduced, the controller shortens the contact time, and
   when the coating amount is to be increased, the controller extends the contact time.

5. A coating method of applying a liquid material to a surface of a target object using a coating needle in a coating apparatus,
   the coating apparatus including
      a coating unit configured to be replaceable and including a container and the coating needle, the container being configured to hold the liquid material,
      a first driving device configured to move the coating needle up and down, and a second driving device configured to move the coating unit up and down relative to the target object, the coating method comprising:
acquiring an operation parameter set corresponding to the coating unit attached;
applying the liquid material to a surface of the target object by bringing the coating needle into contact with the target object using the first and second driving devices;
measuring a coating amount of the liquid material applied; and
adjusting the operation parameter based on the measured coating amount of the liquid material, wherein the container has a bottom having a hole, the applying of the liquid material includes applying the liquid material to the surface of the target object by moving the coating unit down using the second driving device while allowing the coating needle to protrude from the hole using the first driving device, and bringing the coating needle into contact with the target object, and the adjusting of the operation parameter includes
reducing the push amount when the coating amount is to be reduced, and
increasing the push amount when the coating amount is to be increased.

* * * * *